United States Patent
Park

(10) Patent No.: US 6,865,110 B1
(45) Date of Patent: Mar. 8, 2005

(54) PROGRAM VOLTAGE GENERATION CIRCUIT FOR STABLY PROGRAMMING FLASH MEMORY CELL AND METHOD OF PROGRAMMING FLASH MEMORY CELL

(75) Inventor: Jae-Kwan Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/810,291

(22) Filed: Mar. 26, 2004

(30) Foreign Application Priority Data

Aug. 22, 2003 (KR) .................................. 10-2003-0058253

(51) Int. Cl.$^7$ .............................................. G11C 16/12
(52) U.S. Cl. .............................. 365/185.18; 365/185.2; 365/185.33
(58) Field of Search .................... 365/185.18, 185.2, 365/185.33, 185.29

(56) References Cited

U.S. PATENT DOCUMENTS 6,134,141 A * 10/2000 Wong .................... 365/185.03

* cited by examiner

*Primary Examiner*—Andrew Q. Tran
(74) *Attorney, Agent, or Firm*—Mills & Onello, LLP

(57) ABSTRACT

Provided are a program voltage generation circuit for achieving stable programming of a flash memory cell, and a method of programming a flash memory cell. In the program voltage generation circuit, a program wordline voltage to be applied to the gate of a flash memory cell is generated in response to a sink current provided by a constant current source and the result of a comparison between a reference voltage and a bitline voltage. The bitline voltage is generated according to a program current flowing to the first flash memory cell. A bitline current control voltage is generated in response to the program current that flows to a second flash memory cell in response to the program wordline voltage. Accordingly, even when the characteristics of the flash memory cell vary due to a change of a manufacturing process thereof, a constant program wordline voltage, a constant bitline voltage, and a constant bitline current control voltage are generated, and thus the flash memory cell is stably programmed.

8 Claims, 6 Drawing Sheets

| OPERATION | Vwl [V] | Vs [V] | Vbl [V] |
|---|---|---|---|
| READING | 1.5 | 0 | 0.7 |
| PROGRAMMING | 1.4 | 8 | 0.4 |
| ERASURE | 11.0 | 0 | 0 |

US 6,865,110 B1

1

PROGRAM VOLTAGE GENERATION CIRCUIT FOR STABLY PROGRAMMING FLASH MEMORY CELL AND METHOD OF PROGRAMMING FLASH MEMORY CELL

BACKGROUND OF THE INVENTION

This application claims the priority of Korean Patent Application No. 2003-58253, filed on Aug. 22, 2003, in the Korean Intellectual Property Office, the contents of which are incorporated herein in their entirety by reference.

1. Field of the Invention

The present invention relates to a semiconductor memory device, and more particularly, to a program voltage generation circuit for stably programming a flash memory cell and a method of programming a flash memory cell.

2. Description of the Related Art

As flash memory is used in, for example, portable products and built-in products both having increased storage capacities. The demand for flash memory is sharply increasing. Flash memory can replace large storage media such as a hard disk and is used in, for example, digital cameras, voice mail systems, and the like. Compared with nonvolatile memory devices that can perform electrical programming and erasure, NOR flash memory devices perform exceedingly fast programming and reading, so that they are very popular to users who want a fast operation.

FIG. 1 is a schematic diagram of a flash memory cell. Referring to FIG. 1, the flash memory cell has a structure in which a floating gate and a control gate are formed over a channel region between a source and a drain. The flash memory cell is programmed using a Channel Hot Electron Injection (CHEI) method, where channel hot electrons are formed on the side of the drain and injected into the floating gate. Also, the flash memory cell performs erasure by erasing the electrons stored in the floating gate using a Fowler-Nordheim tunneling technique.

FIG. 2 is a circuit diagram of a core cell array of a NOR flash memory. Referring to FIG. 2, zeroth through j-th word lines are arrayed in rows, and zeroth through i-th bit lines are arrayed in columns, thereby forming a matrix. In this matrix, flash memory cells as shown in FIG. 1 are formed at intersection points between the zeroth through j-th word lines and the zeroth through i-th bit lines. Word line voltages Vwl(j) are applied to control gates of the flash memory cells, source voltages Vs(k) are applied to sources thereof, and bit line voltages Vbl(i) are applied to drains thereof.

Reading, programming, and erasure of flash memory cells are performed using operating voltages shown in FIG. 3. Referring to FIG. 3, the flash memory cells are read out using a word line voltage Vwl of about 1.5V, a source voltage Vs of 0V, and a bit line voltage Vbl of about 0.7V. The flash memory cells are programmed using a word line voltage Vwl of about 1.4V, a source voltage Vs of about 8V, and a bit line voltage Vbl of about 0.4V. The flash memory cells are erased using a word line voltage Vwl of about 11V, a source voltage Vs of 0V, and a bit line voltage Vbl of 0V.

Particularly, a flash memory cell is programmed by increasing its threshold voltage while channel hot electrons generated by a big potential difference applied to the drain and source of the flash memory cell are moving to the floating gate. Upon such programming, a predetermined amount of operating current is consumed. The performance of flash memory depends on how much the operation current consumption is reduced. Also, when a flash memory cell is programmed, the bit line voltage Vbl must be applied to the drain of the flash memory cell in order to prevent its threshold voltage from being changed due to unintended stress, that is, punch through disturbing caused by unselected flash memory cells because of the structure of a flash memory cell array in which a plurality of flash memory cells share a bit line.

FIG. 4 is a schematic circuit diagram of a conventional program wordline voltage generation circuit. Referring to FIG. 4, a constant current generator 410 generates a program current Ipgm. A first PMOS transistor P1 transfers the program current Ipgm to a second PMOS transistor P2. Here, the first and second PMOS transistors P1 and P2 constitute a current mirror. The program current Ipgm flows along a path from the second PMOS transistor P2 to a resistor R via a cell capacitor C1. The cell transistor C1 is formed of a diode type in which a control gate and a drain are coupled to each other. A voltage for a connection node between the second PMOS transistor P2 and the cell transistor C is generated as a wordline voltage Vwl and provided to a core cell array.

FIG. 5 is a graph showing a distribution of the program wordline voltage Vwl generated by the conventional program wordline voltage generation circuit of FIG. 4. Referring to FIG. 5, the program wordline voltage Vwl is changed to first, second, and third program wordline voltages Vwl1, Vwl2, and Vwl3 as the program current Ipgm is changed to first, second, and third program currents Ipgm1, Ipgm2, and Ipgm3. That is, a variation in the program current Ipgm directly affects the generation of the program wordline voltage Vwl. The program current Ipgm varies with a change in a process of manufacturing a flash memory device, and the variation of the program current Ipgm changes the level of the wordline voltage Vwl of FIG. 4 desired upon programming. The variation of the program current Ipgm also changes the bitline voltage Vbl applied to both ends of the resistor R of the conventional program wordline voltage generation circuit of FIG. 4.

FIG. 6 is a schematic circuit diagram of a conventional circuit for controlling a bitline current that is applied to bitlines of a flash memory cell upon programming. Referring to FIG. 6, a constant current source 610 generates a program current Ipgm. A third PMOS transistor P3 transfers the program current Ipgm to a fourth PMOS transistor P4. Here, the third and fourth PMOS transistors P3 and P4 constitute a current mirror. The program current Ipgm flows along a path of from the fourth PMOS transistor P4 to an NMOS transistor N1 whose gate and drain are coupled to each other. Referring to FIG. 7, which is a graph showing the operation of the NMOS transistor N1, if the constant program current Ipgm flows along a path between the drain and source of the NMOS transistor N1, a voltage flowing between the gate and source of the NMOS transistor N1 is a bitline current control voltage Vgc.

The bitline current control voltage Vgc is applied to the gate of an NMOS transistor N2 coupled to a flash memory cell C2 of FIG. 8. The program wordline voltage Vwl and the bitline voltage Vbl are respectively applied to the gate and drain of the flash memory cell C2. While the program current Ipgm is flowing to the flash memory cell C2 provided with the aforementioned voltages, the flash memory cell C2 is programmed.

To program the flash memory cell C2, the wordline voltage generation circuit of FIG. 4 and the bitline current control circuit of FIG. 6 must be exactly aware of the current characteristics of the flash memory cell C2 in order to set an ideal program current Ipgm. If the program current Ipgm varies with a process change, the program wordline voltage Vwl, which causes the program current Ipgm to flow into the flash memory cell C2, also varies, which impedes generation of an accurate program current Ipgm to flow to the flash memory cell C2. Consequently, the flash memory cell C2 is unstably programmed.

Therefore, a flash memory device that can program flash memory cells by providing a program wordline voltage Vwl and a bitline current control voltage Vgc that are stable against a process change is required.

SUMMARY OF THE INVENTION

One aspect of the present invention provides a program voltage generation circuit for generating a program wordline voltage, a bitline voltage, and a bitline current control voltage that are used to stably program flash memory cells regardless of a change in a manufacturing process thereof.

Another aspect of the present invention provides a method of programming flash memory cells.

According to one aspect of the present invention, there is provided a program voltage generation circuit for achieving stable programming of flash memory cells. This program voltage generation circuit includes a constant current source, a program wordline voltage generation unit, a bitline voltage generation unit, and a bitline current control voltage generation unit. The constant current source provides a sink current. The program wordline voltage generation unit generates a program wordline voltage applied to the gate of a flash memory cell, in response to the sink current and the result of a comparison between a reference voltage and a bitline voltage. The bitline voltage generation unit generates the bitline voltage according to a program current flowing to the first flash memory cell. The bitline current control voltage generation unit generates a bitline current control voltage in response to the program current that flows to a second flash memory cell in response to the program wordline voltage.

In one embodiment, the program wordline voltage generation unit comprises: a first PMOS transistor which has a source coupled to a power supply voltage and a gate and a drain that are coupled to each other; a first NMOS transistor which has a source coupled to a ground voltage and a gate and a drain that are coupled to each other, and is coupled to the drain of the PMOS transistor, a second NMOS transistor which has a source coupled to the ground voltage, a gate coupled to the gate of the first NMOS transistor to form a current mirror, and a drain coupled to the program wordline voltage; a second PMOS transistor which is connected between the power supply voltage and the drain of the second NMOS transistor and has a gate coupled to an output of a voltage comparator, and the voltage comparator which compares the bitline voltage with the reference voltage and provides the output corresponding to the result of the comparison to the gate of the second PMOS transistor.

In one embodiment, the bitline voltage generation unit comprises: the first flash memory cell which has a source coupled to a source voltage and a gate coupled to the program wordline voltage; and a resistor which is coupled between the drain of the first flash memory cell and the ground voltage and generates the bitline voltage.

The bitline current control voltage generation unit can include: a second flash memory cell which has a source coupled to a source voltage and a gate coupled to the program wordline voltage; and an NMOS transistor which has a source coupled to a ground voltage and a gate and a drain that are coupled to the drain of the second flash memory cell and generate the bitline current control voltage. The flash memory device comprises: a flash memory cell in a flash memory cell core array to be programmed, which has a gate coupled to the program wordline voltage, a source coupled to the source voltage, and a drain coupled to the bitline voltage; and an NMOS transistor gated to the bitline current control voltage between the drain of the flash memory cell and the ground voltage.

According to one aspect of the present invention, there is provided another program voltage generation circuit for achieving stable programming of flash memory cells. This program voltage generation circuit includes a constant current source, a second PMOS transistor, a voltage comparator, first and second flash memory cells, a resistor, and an NMOS transistor. The constant current source includes a first PMOS transistor and first and second NMOS transistors. The first PMOS transistor has a source coupled to a power supply voltage and a gate and a drain that are coupled to each other. The first NMOS transistor has a source coupled to a ground voltage and a gate and a drain that are coupled to each other, and is coupled to the drain of the first PMOS transistor. The second NMOS transistor has a source coupled to the ground voltage, a gate coupled to the gate of the first NMOS transistor to form a current mirror, and a drain coupled to the program wordline voltage. The second PMOS transistor is connected between the power supply voltage and the drain of the second NMOS transistor and has a gate coupled to an output of the voltage comparator. The voltage comparator compares the bitline voltage with a reference voltage and provides the output corresponding to the result of the comparison to the gate of the second PMOS transistor. The first flash memory cell has a source coupled to a source voltage and a gate coupled to the program wordline voltage. The resistor is coupled between the drain of the first flash memory cell and the ground voltage and generates the bitline voltage according to a program current flowing to the first flash memory cell. The second flash memory cell has a source coupled to a source voltage and a gate coupled to the program wordline voltage. The NMOS transistor has a source coupled to a ground voltage and a gate and a drain that are coupled to the drain of the second flash memory cell and generate a bitline current control voltage according to a program current flowing to the second flash memory cell.

In one embodiment, the flash memory device comprises: a flash memory cell in a flash memory cell core array to be programmed, which has a gate coupled to the program wordline voltage, a source coupled to the source voltage, and a drain coupled to the bitline voltage; and an NMOS transistor gated to the bitline current control voltage between the drain of the flash memory cell and the ground voltage.

According to another aspect of the present invention, there is provided a method of programming a flash memory cell. In this method, a sink current is supplied from a constant current source. Next, a program wordline voltage to be applied to the gate of a flash memory cell is generated in response to the sink current and the result of a comparison between a reference voltage and a bitline voltage. The bitline voltage to be applied to the drain of the first flash memory cell is generated according to a program current flowing to the first flash memory cell. A bitline current control voltage is generated in response to the program current by applying the program wordline voltage to the gate of a second flash memory cell. The program wordline voltage is applied to the gate of the flash memory cell, the bitline voltage is applied to the drain of the flash memory cell, and the bitline current control voltage is applied to the gate of an NMOS transistor coupled between the flash memory cell and a ground voltage, so that the program current flows to the flash memory cell to thereby program the flash memory cell.

In the present invention, a flash memory cell is adopted in the program wordline voltage generation circuit. Accordingly, even when the characteristics of the flash memory cell vary due to a change of a manufacturing process thereof, a constant program wordline voltage Vwl, a constant bitline voltage Vbl, and a constant bitline current control voltage Vgc are generated, and thus the flash memory cell is stably programmed.

BRIEF DESCRIPTION OF THE DRAWINGS

The foregoing and other features and advantages of the invention will be apparent from the more particular description of embodiments of the invention, as illustrated in the accompanying drawings. The drawings are not necessarily to scale, emphasis instead being placed upon illustrating the principles of the invention.

DETAILED DESCRIPTION OF THE INVENTION

Figure 9:
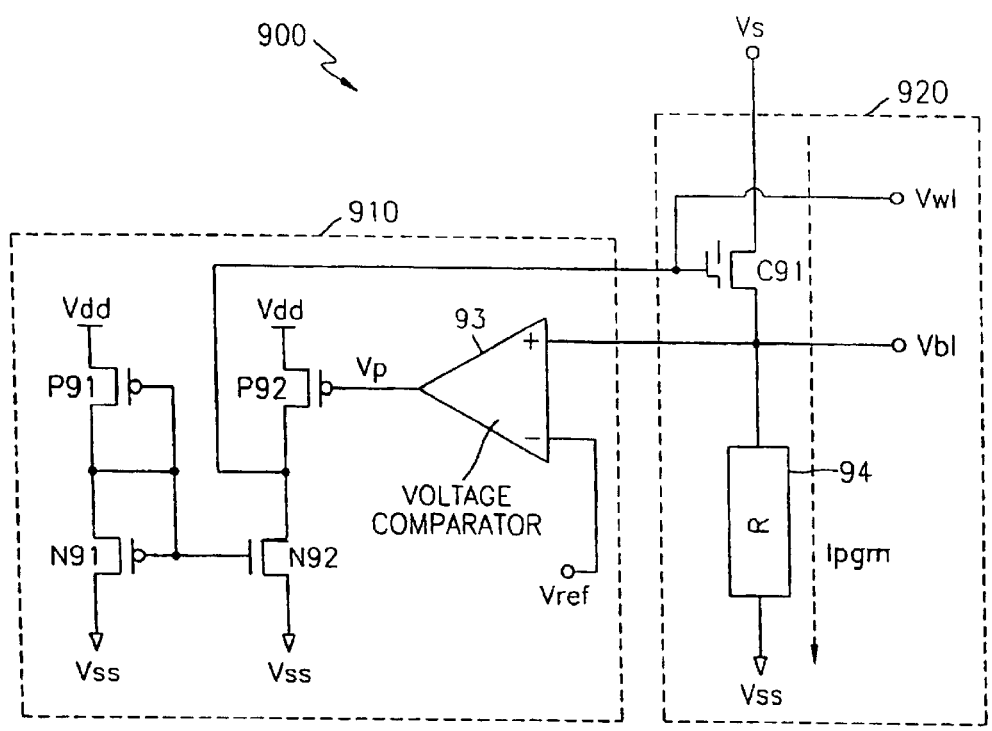
FIG. 9 is a schematic circuit diagram of a program wordline voltage generation circuit according to an embodiment of the present invention.

Referring to FIG. 9, a program wordline voltage generation circuit 900 according to an embodiment of the present invention includes a program wordline voltage generation unit 910 and a bitline voltage generation unit 920.

The program wordline voltage generation unit 910 includes first and second PMOS transistors P91 and P92, first and second NMOS transistors N91 and N92, and a voltage comparator 93. The first PMOS transistor P91 and the first NMOS transistor N91 are serially coupled to each other in a diode configuration between a power supply voltage Vdd and a ground voltage Vss. The first and second NMOS transistors N91 and N92 constitute a current mirror.

The second PMOS transistor P92 is coupled between a power supply voltage Vdd and the second NMOS transistor N92. The voltage comparator 93 compares a reference voltage Vref with a bitline voltage Vbl and provides an output voltage Vp corresponding to the result of the comparison to the second PMOS transistor P92.

The bitline voltage generation unit 920 is coupled between a source voltage Vs and the bitline voltage Vbl and includes a flash memory cell C91 and a resistor 94. The flash memory cell C91 is gated to a program wordline voltage Vwl, which is a connection node between the second PMOS transistor P92 and the second NMOS transistor N92. The resistor 94 is connected between the bitline voltage Vbl and a ground voltage Vss.

The program wordline voltage generation circuit 900 having the above-described structure operates so that the bitline voltage Vbl is finally equal to the reference voltage Vref. When the bitline voltage Vbl is finally equal to the reference voltage Vref, a program wordline voltage Vwl obtained at this time and the bitline voltage Vbl are provided to a flash memory cell so that the flash memory cell can be stably programmed.

To be more specific, an initial program wordline voltage Vwl is determined by a current that flows to the first PMOS transistor P92 and the second NMOS transistor N92 via the first PMOS transistor P91 and the first NMOS transistor N91. An initial program current Ipgm flows to the flash memory cell C91 gated to the initial program wordline voltage Vwl. An initial bitline voltage Vbl to be applied to both ends of the resistor 94 is generated by the initial program current Ipgm.

Figure 1:
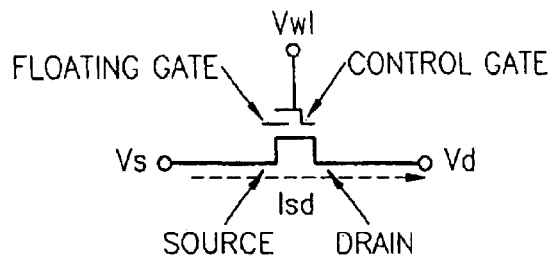
FIG. 1 is a schematic diagram of a flash memory cell.
Figure 2:
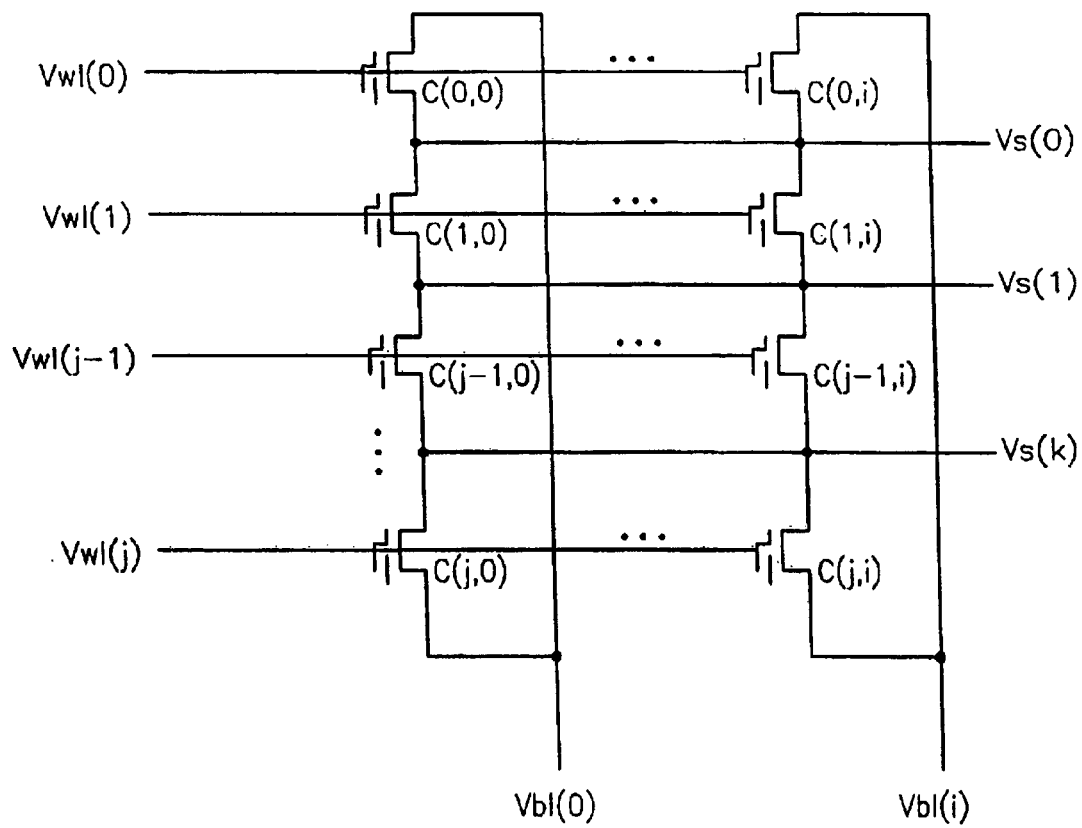
FIG. 2 is a circuit diagram of a core cell array of a NOR flash memory.
Figures 3, 4:
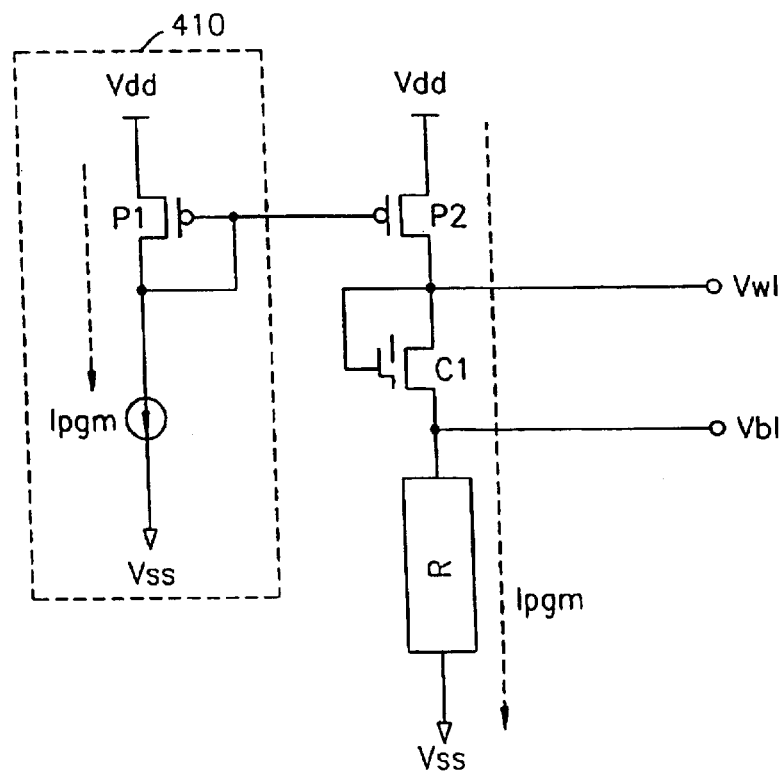
FIG. 3 is a table showing the levels of voltages according to the operation modes of flash memory cells.
FIG. 4 is a schematic circuit diagram of a conventional program wordline voltage generation circuit.
Figure 5:
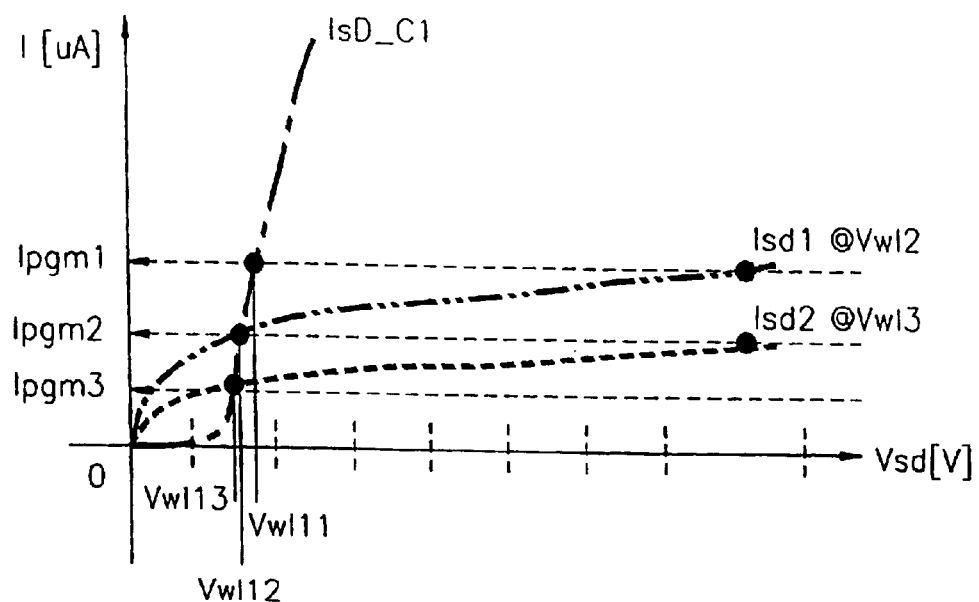
FIG. 5 is a graph showing a distribution of the program wordline voltage Vwl generated by the conventional program wordline voltage generation circuit of FIG. 4.
Figure 6:
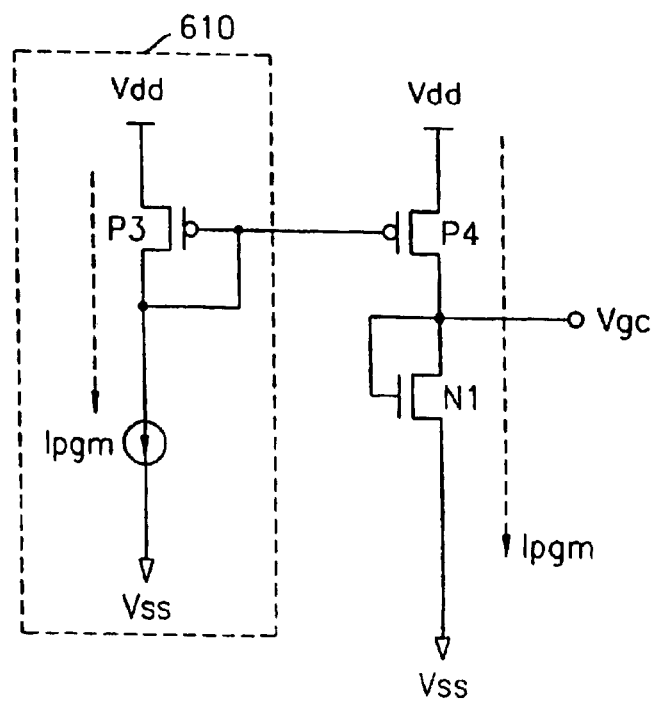
FIG. 6 is a schematic circuit diagram of a conventional circuit for controlling a bitline current.
Figure 7:
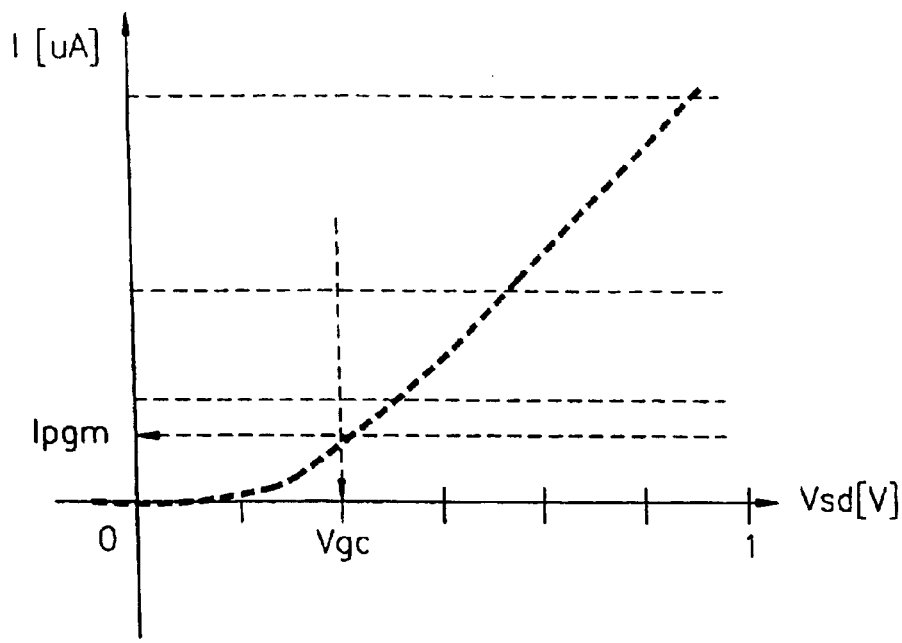
FIG. 7 is a graph showing the operation of the NMOS transistor of FIG. 6.
Figure 8:
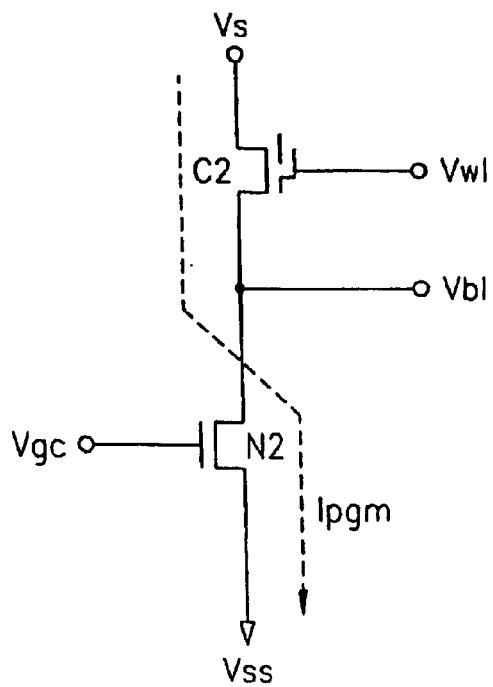
FIG. 8 is a circuit diagram for illustrating programming of a flash memory cell using a conventional program wordline voltage, a conventional bitline voltage, and a conventional bitline current control voltage.

The initial bitline voltage Vbl is provided to the voltage comparator 93 and compared with the reference voltage Vref. The reference voltage Vref is set to about 0.4V, which is the bitline voltage Vbl used upon the programming of FIG. 3. If the initial bitline voltage Vbl is lower than the reference voltage Vref, the output voltage Vp of the voltage comparator 93 has a logic low level. The amount of current flowing in the second PMOS transistor P92 increases in response to the output voltage Vp of the logic low level. Accordingly, the level of the initial program wordline voltage Vwl increases. An increased program wordline voltage Vwl increases the amount of the program current Ipgm flowing to the flash memory cell C91. Hence, the initial bitline voltage Vbl applied to both ends of the resistor 94 is increased.

An increased bitline voltage Vbl is provided to the voltage comparator 93 and compared with the reference voltage Vref. If the increased bitline voltage Vbl is higher than the reference voltage Vref, the output voltage Vp of the voltage comparator 93 has a logic high level. The amount of current supplied from the second PMOS transistor P92 increases in response to the output voltage Vp of the logic high level. In this case, the level of the increased program wordline voltage Vwl is lowered due to an operation of the current mirror constituted with the first and second NMOS transistors N91 and N92. A lowered program wordline voltage Vwl decreases the amount of program current Ipgm flowing to the flash memory cell C91. Hence, the increased bitline voltage Vbl applied to both ends of the resistor 94 is decreased.

By repeating these operations, the program wordline voltage generation circuit 900 generates a program wordline voltage Vwl having the same level as a reference voltage Vref. A program current Ipgm determined at this time determines a final bitline voltage Vbl.

Figure 10:
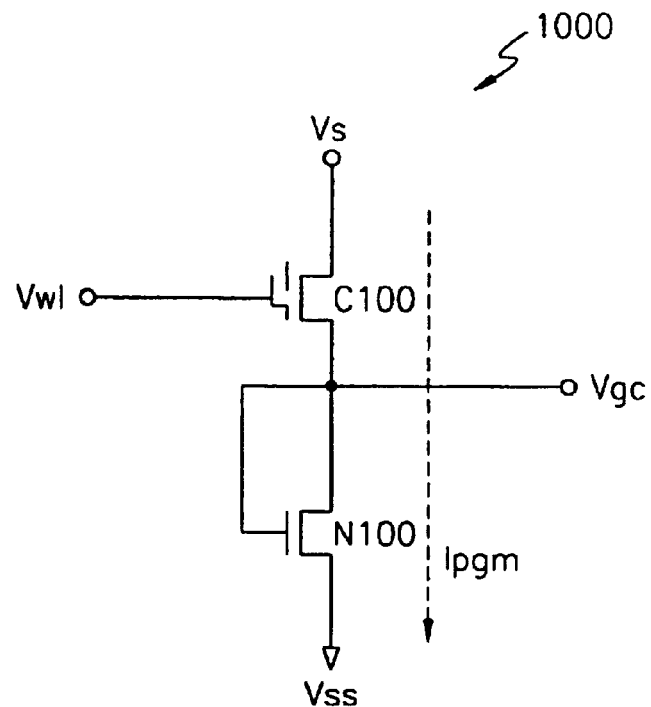
FIG. 10 is a schematic circuit diagram of a bitline current control circuit according to an embodiment of the present invention.

FIG. 10 is a schematic circuit diagram of a bitline current control circuit 1000 according to an embodiment of the present invention. The bit line current control voltage generation circuit 1000 includes a flash memory cell C100 and an NMOS diode transistor N100 that is serially connected to the flash memory cell C100. The flash memory cell C100 is gated to a program wordline voltage Vwl connected between a source voltage Vs and aground voltage Vss. In the flash memory cell C100, a program current Ipgm flows in response to the program wordline voltage Vwl generated by the program wordline voltage generation circuit 900 of FIG. 9. Because of the program current Ipgm, a bitline current control voltage Vgc is applied between the drain and source of the NMOS transistor N100.

Figure 11:
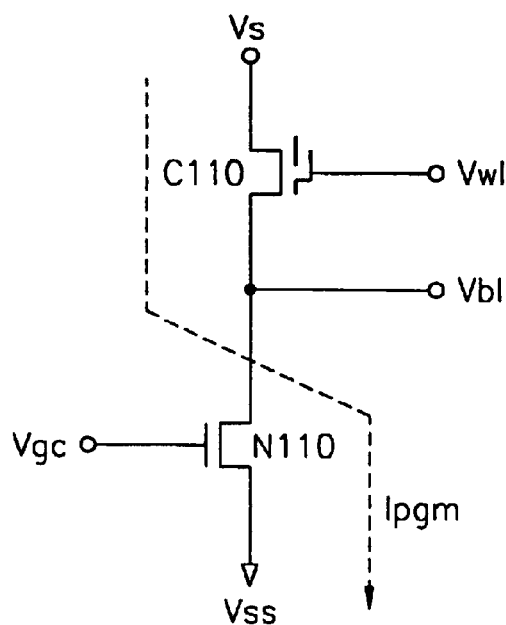
FIG. 11 is a circuit diagram for illustrating programming of a flash memory cell using a program wordline voltage according to the present invention, a bitline voltage according to the present invention, and a bitline current control voltage according to the present invention.

The program wordline voltage Vwl, the bitline voltage Vbl, and the bitline current control voltage Vgc that are finally generated in the embodiment of the present invention are respectively applied to the gate and drain of a flash memory cell C110 of FIG. 11 and an NMOS transistor N110 of FIG. 11, thereby programming the flash memory cell C110. When the flash memory cell C110 is programmed, a program current Ipgm flowing to the flash memory cell C110 is equal to the program current Ipgm flowing in the flash memory cell C91 of the program voltage generation circuit 900 of FIG. 9 and to the program current Ipgm flowing in the flash memory cell C100 of the bitline current control voltage generation circuit 1000.

Hence, in the present invention, a program wordline voltage Vwl has the same level as a predetermined reference voltage Vref. A program current Ipgm flowing to the flash memory cell C91 of FIG. 9 in response to the program wordline voltage Vwl is used upon generation of a bitline current control voltage Vgc. Upon program of a flesh memory cell, the program wordline voltage Vwl and the bitline current control voltage Vgc are used so that the program current Ipgm can flow as a current used for programming the flash memory cell. Accordingly, even when the characteristics of the flash memory cell vary due to a change of a manufacturing process thereof, a constant program wordline voltage Vwl, a constant bitline voltage Vbl, and a constant bitline current control voltage Vgc are generated, and thus the flash memory cell is stably programmed.

While the present invention has been particularly shown and described with reference to exemplary embodiments thereof, it will be understood by those of ordinary skill in the art that various changes in form and details may be made therein without departing from the spirit and scope of the present invention as defined by the following

What is claimed is:

1. A program voltage generation circuit in a flash memory, for achieving stable programming of flash memory cells, the program voltage generation circuit comprising:
    a constant current source which provides a sink current;
    a program wordline voltage generation unit which generates a program wordline voltage applied to the gate of a first flash memory cell, in response to the sink current and the result of a comparison between a reference voltage and a bitline voltage;
    a bitline voltage generation unit which generates the bitline voltage according to a program current flowing to the first flash memory cell; and
    a bitline current control voltage generation unit which generates a bitline current control voltage in response to the program current that flows to a second flash memory cell in response to the program wordline voltage.

2. The program voltage generation circuit of claim 1, wherein the program wordline voltage generation unit comprises:
    a first PMOS transistor which has a source coupled to a power supply voltage and a gate and a drain that are coupled to each other;
    a first NMOS transistor which has a source coupled to a ground voltage and a gate and a drain that are coupled to each other, and is coupled to the drain of the first PMOS transistor;
    a second NMOS transistor which has a source coupled to the ground voltage, a gate coupled to the gate of the first NMOS transistor to form a current mirror, and a drain coupled to the program wordline voltage;
    a second PMOS transistor which is connected between the power supply voltage and the drain of the second NMOS transistor and has a gate coupled to an output of a voltage comparator; and
    the voltage comparator which compares the bitline voltage with the reference voltage and provides the output corresponding to the result of the comparison to the gate of the second PMOS transistor.

3. The program voltage generation circuit of claim 1, wherein the bitline voltage generation unit comprises:
    the first flash memory cell which has a source coupled to a source voltage and a gate coupled to the program wordline voltage; and
    a resistor which is coupled between the drain of the first flash memory cell and the ground voltage and generates the bitline voltage.

4. The program voltage generation circuit of claim 1, wherein the bitline current control voltage generation unit comprises:
    the second flash memory cell which has a source coupled to a source voltage and a gate coupled to the program wordline voltage; and
    an NMOS transistor which has a source coupled to a ground voltage and a gate and a drain that are coupled to the drain of the second flash memory cell and generate the bitline current control voltage.

5. The program voltage generation circuit of claim 4, wherein the flash memory device comprises:
    a flash memory cell in a flash memory cell core array to be programmed, which has a gate coupled to the program wordline voltage, a source coupled to the source voltage, and a drain coupled to the bitline voltage, and
    a second NMOS transistor gated with the bitline current control voltage and connected between the drain of the flash memory cell and the ground voltage.

6. A program voltage generation circuit in the flash memory, device for achieving stable programming of flash memory cells, the program voltage generation circuit comprising:
    a constant current source which includes a first PMOS transistor and first and second NMOS transistors, wherein the first PMOS transistor has a source coupled to a power supply voltage and a gate and a drain that are coupled to each other, the first NMOS transistor has a source coupled to a ground voltage and a gate and a drain that are coupled to each other, and is coupled to the drain of the first PMOS transistor, and the second NMOS transistor has a source coupled to the ground voltage, a gate coupled to the gate of the first NMOS transistor to form a current mirror, and a drain coupled to a program wordline voltage;

a second PMOS transistor which is connected between the power supply voltage and the drain of the second NMOS transistor and has a gate coupled to an output of a voltage comparator;

the voltage comparator which compares a bitline voltage with a reference voltage and provides the output corresponding to the result of the comparison to the gate of the second PMOS transistor;

a first flash memory cell which has a source coupled to a source voltage and a gate coupled to the program wordline voltage;

a resistor which is coupled between the drain of the first flash memory cell and the ground voltage and generates the bitline voltage according to a program current flowing to the first flash memory cell;

a second flash memory cell which has a source coupled to the source voltage and a gate coupled to the program wordline voltage; and a third NMOS transistor which has a source coupled to the ground voltage and a gate and a drain that are coupled to the drain of the second flash memory cell and generate a bitline current control voltage according to a program current flowing to the second flash memory cell.

7. The program voltage generation circuit of claim 6, wherein the flash memory device comprises:

a flash memory cell in a flash memory cell core array to be programmed, which has a gate coupled to the program wordline voltage, a source coupled to the source voltage, and a drain coupled to the bitline voltage; and a fourth NMOS transistor gated with the bitline current control voltage and connected between the drain of the flash memory cell and the ground voltage.

8. A method of programming a flash memory cell, the method comprising:

supplying a sink current from a constant current source;

generating a program wordline voltage applied to the gate of a first flash memory cell, in response to the sink current and the result of a comparison between a reference voltage and a bitline voltage;

generating the bitline voltage to be applied to the drain of the first flash memory cell, according to a program current flowing to the first flash memory cell;

generating a bitline current control voltage in response to the program current by applying the program wordline voltage to the gate of a second flash memory cell; and programming the flash memory cell by flowing the program current to the flash memory cell by applying the program wordline voltage to the gate of the flash memory cell, the bitline voltage to the drain of the flash memory cell, and the bitline current control voltage to the gate of an NMOS transistor coupled between the flash memory cell and a ground voltage.

* * * * *

UNITED STATES PATENT AND TRADEMARK OFFICE
CERTIFICATE OF CORRECTION

PATENT NO. : 6,865,110 B1
DATED : March 8, 2005
INVENTOR(S) : Jae-Kwan Park

It is certified that error appears in the above-identified patent and that said Letters Patent is hereby corrected as shown below:

Column 8,
Line 47, please delete "," and insert -- ; --.
Line 52, after "memory", please delete "," and insert -- , -- after "device".

Column 9,
Line 24, please delete "a" and insert -- the --.

Signed and Sealed this

Seventh Day of June, 2005

JON W. DUDAS
*Director of the United States Patent and Trademark Office*